(12) United States Patent
Tanaka et al.

(10) Patent No.: US 12,162,376 B2
(45) Date of Patent: Dec. 10, 2024

(54) ELECTRIC-VEHICLE-MOUNTED COOLING APPARATUS

(71) Applicant: SUBARU CORPORATION, Tokyo (JP)

(72) Inventors: Yasufumi Tanaka, Tokyo (JP); Hayata Mimatsu, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 418 days.

(21) Appl. No.: 17/584,550

(22) Filed: Jan. 26, 2022

(65) Prior Publication Data

US 2022/0264774 A1 Aug. 18, 2022

(30) Foreign Application Priority Data

Feb. 17, 2021 (JP) ................. 2021-023245

(51) Int. Cl.
*B60L 58/26* (2019.01)
*H05K 7/20* (2006.01)

(52) U.S. Cl.
CPC ........... *B60L 58/26* (2019.02); *B60L 2210/40* (2013.01); *H05K 7/20927* (2013.01); *H05K 7/20945* (2013.01)

(58) Field of Classification Search
CPC .. B60L 58/26; B60L 2210/40; B60L 2240/36; B60L 58/20; B60L 2240/525; B60L 1/02; H05K 7/20927; H05K 7/20945; H05K 7/20972; B60K 1/00; B60K 11/04; B60K 2001/005; B60K 2001/006
See application file for complete search history.

(56) References Cited

U.S. PATENT DOCUMENTS

2020/0353790 A1* 11/2020 Miyoshi ................. B60H 1/143
2021/0094443 A1* 4/2021 Aikawa ................... B60L 58/26

FOREIGN PATENT DOCUMENTS

| DE | 102016206835 A1 * | 8/2017 | .......... B60L 11/1803 |
| JP | 2005-188333 A | 7/2005 | |
| JP | 2009-261197 A | 11/2009 | |
| JP | 2012-165588 A | 8/2012 | |

OTHER PUBLICATIONS

Japanese Office Action in JPA No. 2021-023245 issued on Jun. 25, 2024 with English translation thereof.

* cited by examiner

*Primary Examiner* — Charles Cai
(74) *Attorney, Agent, or Firm* — MCGINN I.P. LAW GROUP, PLLC

(57) ABSTRACT

An electric-vehicle-mounted cooling apparatus is to be mounted in or on an electric vehicle including an electric motor, a first battery, and an inverter. The electric motor is configured to output power for driving. The first battery is configured to store electric power for driving. The inverter is configured to receive the electric power from the first battery and to drive the electric motor. The electric-vehicle-mounted cooling apparatus includes a cooling mechanism and a controller. The cooling mechanism is configured to cool the inverter. The controller is configured to switch a cooling level for the inverter. The inverter is configured to be cooled by the cooling mechanism. The controller is configured to switch the cooling level based on output from the inverter.

6 Claims, 4 Drawing Sheets

ELECTRIC-VEHICLE-MOUNTED COOLING APPARATUS

CROSS-REFERENCE TO RELATED APPLICATIONS

The present application claims priority from Japanese Patent Application No. 2021-023245 filed on Feb. 17, 2021, the entire contents of which are hereby incorporated by reference.

BACKGROUND

The disclosure relates to an electric-vehicle-mounted cooling apparatus.

Japanese Unexamined Patent Application Publication No. 2005-188333 discloses a cooling apparatus configured to cool a downverter (converter) and a power drive unit (inverter) in an electric vehicle by using cooling water. The cooling apparatus switches between control states of radiator fans in accordance with the temperature of the downverter and the temperature of the power drive unit.

SUMMARY

An aspect of the disclosure provides an electric-vehicle-mounted cooling apparatus to be mounted in or on an electric vehicle. The electric vehicle includes an electric motor, a first battery, and an inverter. The electric motor is configured to output power for driving. The first battery is configured to store electric power for driving. The inverter is configured to receive the electric power from the first battery and to drive the electric motor. The electric-vehicle-mounted cooling apparatus includes a cooling mechanism and a controller. The cooling mechanism is configured to cool the inverter. The controller is configured to switch a cooling level for the inverter. The inverter is configured to be cooled by the cooling mechanism. The controller is configured to switch the cooling level based on output from the inverter.

An aspect of the disclosure provides an electric-vehicle-mounted cooling apparatus to be mounted in or on an electric vehicle. The electric vehicle includes an electric motor, a first battery, and an inverter. The electric motor is configured to output power for driving. The first battery is configured to store electric power for driving. The inverter is configured to receive the electric power from the first battery and to drive the electric motor. The electric-vehicle-mounted cooling apparatus includes a cooling mechanism and circuitry. The cooling mechanism is configured to cool the inverter. The circuitry is configured to switch a cooling level for the inverter. The inverter is configured to be cooled by the cooling mechanism. The circuitry is configured to switch the cooling level based on output from the inverter.

BRIEF DESCRIPTION OF THE DRAWINGS

The accompanying drawings are included to provide a further understanding of the disclosure and are incorporated in and constitute a part of this specification. The drawings illustrate an example embodiment and, together with the specification, serve to explain the principles of the disclosure.

DETAILED DESCRIPTION

Cooling levels for an inverter that drives a motor for driving are switched as a function of the temperature of the inverter. In some cases, however, such an operation does not provide sufficient cooling power when high output power from the inverter is requested, resulting in a high temperature of the inverter.

It is desirable to provide an electric-vehicle-mounted cooling apparatus capable of cooling an inverter efficiently when high output power from the inverter is requested.

In the following, an embodiment of the disclosure is described in detail with reference to the accompanying drawings. Note that the following description is directed to an illustrative example of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiment which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same numerals to avoid any redundant description.

Figure 1:
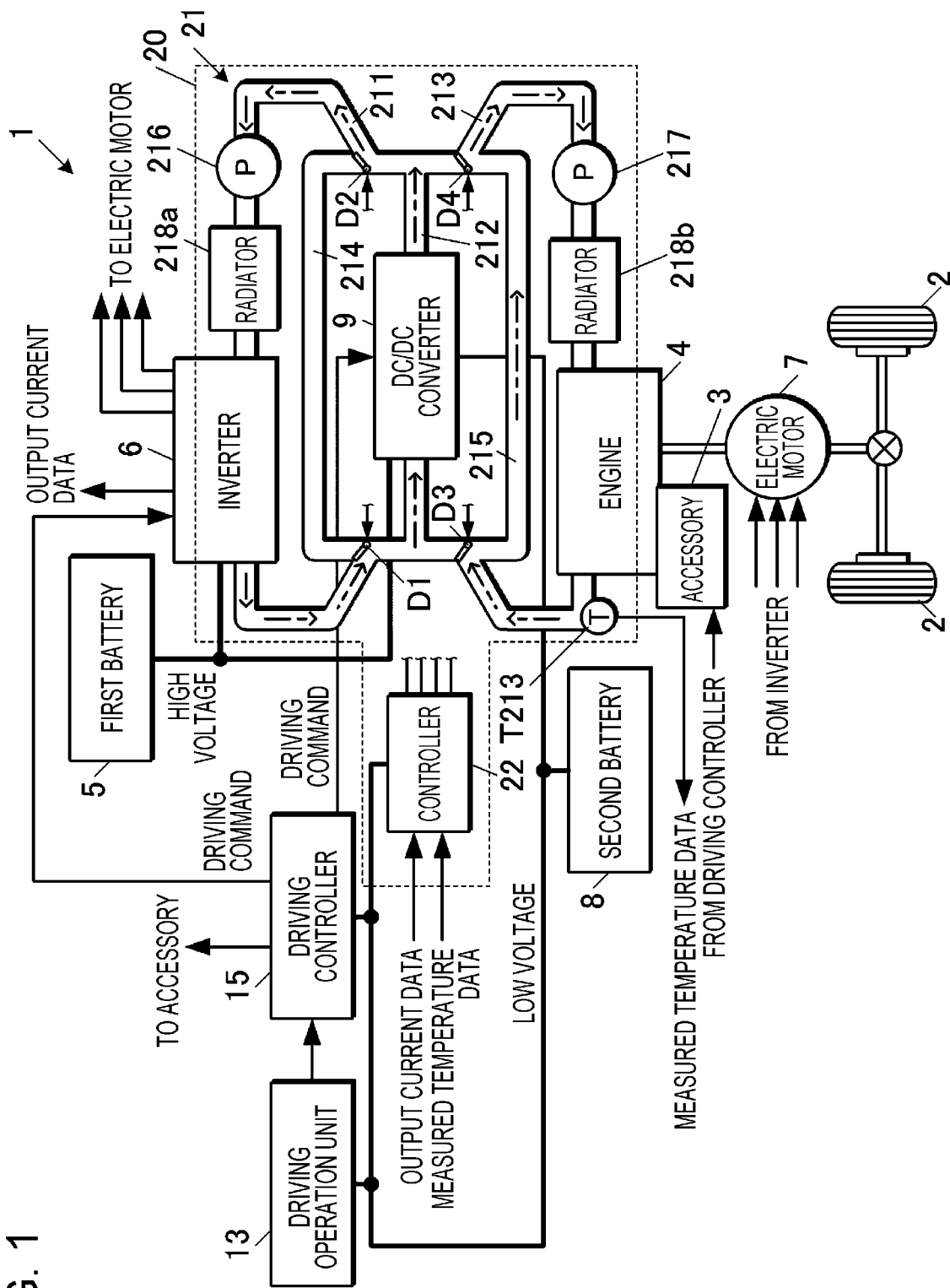
FIG. 1 is a block diagram illustrating an electric vehicle that includes a cooling apparatus according to an embodiment of the disclosure.

FIG. 1 is a block diagram illustrating an electric vehicle that includes a cooling apparatus according to the embodiment of the disclosure. An electric vehicle 1 in FIG. 1 is a hybrid electric vehicle (HEV) that includes an engine 4, which is an internal combustion engine, and an electric motor 7, which generates power for driving.

In addition, the electric vehicle 1 includes drive wheels 2 configured to be driven by the engine 4 or the electric motor 7, an accessory 3 configured to drive the engine 4, a first battery 5 configured to store electric power for driving and to supply a high voltage, an inverter 6 configured to receive the electric power from the first battery 5 and to drive the electric motor 7, a second battery 8 configured to supply a lower power-supply voltage (for example, a low voltage for a 12 V system) than the first battery 5, a direct-current/direct-current (DC/DC) converter 9 capable of supplying the lower power-supply voltage by receiving the electric power from the first battery 5, a cooling apparatus 20 configured to cool the engine 4, the inverter 6, and the DC/DC converter 9, a driving operation unit 13 configured to receive a driving operation, and a driving controller 15 configured to operate, based on a signal that is output from the driving operation unit 13, the accessory 3 and the inverter 6 and to control power that is output to the drive wheels 2. The lower power-supply voltage, which is supplied from the second battery 8 and the DC/DC converter 9, is provided to a portion of the accessory 3, control system components (such as the driving controller 15 and a controller 22 of the cooling apparatus 20), and electrically driven components except the electric motor 7 (such as switching valves D1 to D4 of the cooling apparatus 20).

The driving controller 15 is formed by an electronic control unit (ECU) or multiple ECUs configured to operate in cooperation with each other. The driving controller 15 is configured to calculate requested torque in response to an operation signal from the driving operation unit 13 (mainly, an operation signal from an accelerator operation unit) and to operate the accessory 3 and the inverter 6 so as to obtain the requested torque, thereby driving the engine 4, the electric motor 7, or both of the engine 4 and the electric motor 7. The requested torque indicates torque to be output to the drive wheels 2 and is requested by a driving operation.

The inverter 6 includes multiple power semiconductor elements that can be switched on and off by the driving controller 15, and the operation of the power semiconductor elements enables the inverter 6 to output three-phase alternating-current power to the electric motor 7. The driving controller 15 changes the frequency, phase, and root-mean-square current value of the three-phase alternating-current power in accordance with the rotation speed and phase of the electric motor 7, thereby controlling the torque that is output from the electric motor 7.

Rated electric power (maximum rating) that can be output continuously is determined for the inverter 6 in advance. In addition, the inverter 6 has a boost function that enables temporary output of electric power larger than the rated electric power. The boost function enables electric power to be output for a predetermined duration, the electric power being larger than the rated electric power and not larger than the maximum electric power for boost. The rated electric power, the maximum electric power for boost, and the duration of boost are set in advance so as not to degrade the inverter 6.

Thus, during normal operation, the driving controller 15 performs control so that the inverter 6 outputs electric power that does not exceed the rated electric power. Further, under circumstances where large output from the electric motor 7 is temporarily requested, such as during driving uphill or when a rapid increase in acceleration is requested, the driving controller 15 activates the boost function of the inverter 6. Activating the boost function involves an operation in which the driving controller 15 causes the inverter 6 to output boosted electric power (electric power exceeding the rated electric power) while measuring elapsed time. When the time that has elapsed after the activation of the boost function reaches the allowed duration, the driving controller 15 stops output of the boosted electric power and restores output not larger than the rated electric power.

The cooling apparatus 20 includes a cooling mechanism 21 and the controller 22. The cooling mechanism 21 is configured to circulate liquid coolant and to cool objects to be cooled, and the controller 22 is configured to switch a path for the liquid coolant in the cooling mechanism 21.

The cooling mechanism 21 includes a first channel 211, a second channel 212, a third channel 213, bypass channels 214 and 215, switching valves D1 to D4, a first pump 216, and a second pump 217. The first channel 211 enables liquid coolant to flow along the inverter 6, the second channel 212 enables liquid coolant to flow along the DC/DC converter 9, and the third channel 213 enables liquid coolant to flow along the engine 4. The switching valves D1 to D4 can switch a path for liquid coolant that flows through these channels. The first pump 216 is configured to pump liquid coolant through the first channel 211, and the second pump 217 is configured to pump liquid coolant through the third channel 213. Liquid coolant flowing along an object creates a condition in which heat can be released from the object into the liquid coolant flowing in a component such as a water jacket.

In addition, the cooling mechanism 21 includes a radiator 218a disposed on the first channel 211 to release heat from liquid coolant into ambient air and a radiator 218b disposed on the third channel 213 to release heat from liquid coolant into ambient air. Although two separate radiators 218a and 218b are illustrated in FIG. 1, the radiators 218a and 218b may be combined into a single unit. The single unit formed by the radiators 218a and 218b may include two passages, and the first channel 211 and the third channel 213 may be coupled to one of the two passages and the other, respectively. The cooling mechanism 21 further includes a temperature sensor T213 configured to measure the temperature of liquid coolant in the third channel 213.

The controller 22 of the cooling apparatus 20 is formed by an ECU or multiple ECUs configured to operate in cooperation with each other. The controller 22 may be integrated with the driving controller 15. Numerical data representing the output from the temperature sensor T213 and numerical data representing the current that is output from the inverter 6 are sent to the controller 22. Further, information indicating the temperature of the DC/DC converter 9 and information indicating the remaining charge level of the second battery 8 are sent to the controller 22. Based on such information, the controller 22 switches the switching valves D1 to D4 and controls cooling of the engine 4, the inverter 6, and the DC/DC converter 9.

Figure 2A:
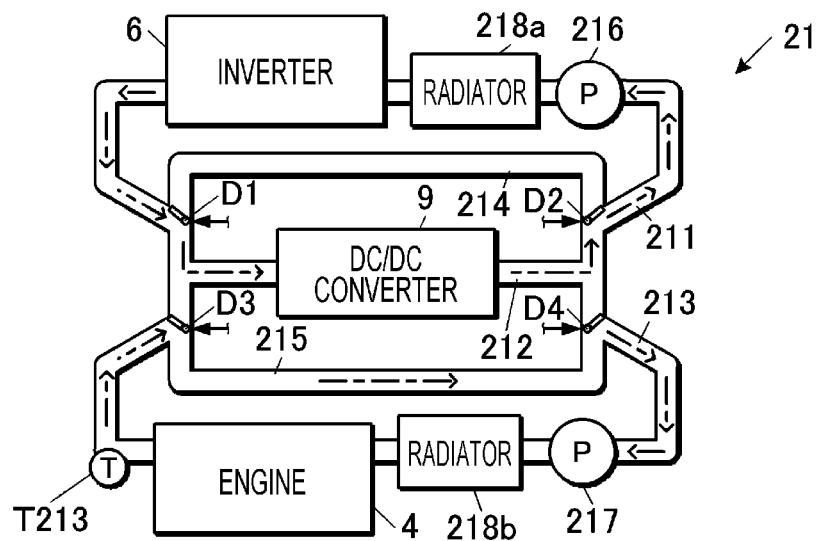
FIGS. 2A, 2B, and 2C illustrate switching of a cooling mechanism with FIG. 2A illustrating a first switching pattern of the cooling mechanism, FIG. 2B illustrating a second switching pattern of the cooling mechanism, and FIG. 2C illustrating a third switching pattern of the cooling mechanism.
Figure 2B:
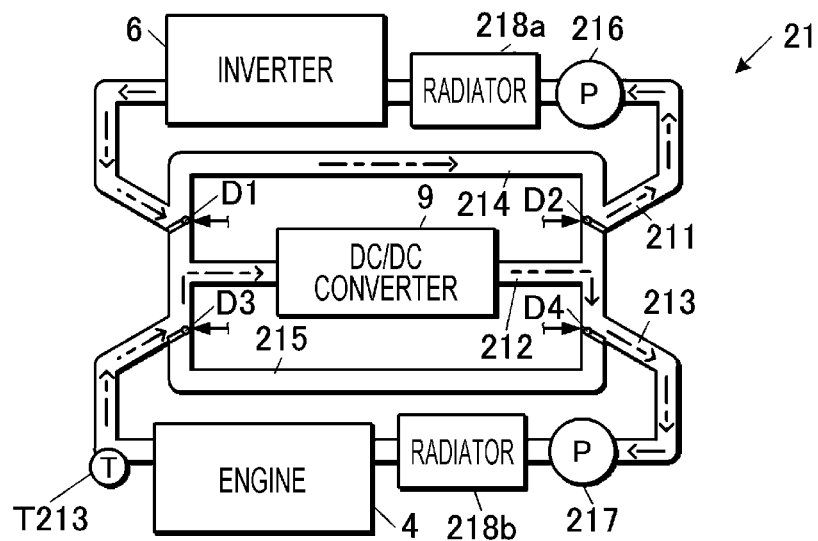
Figure 2C:
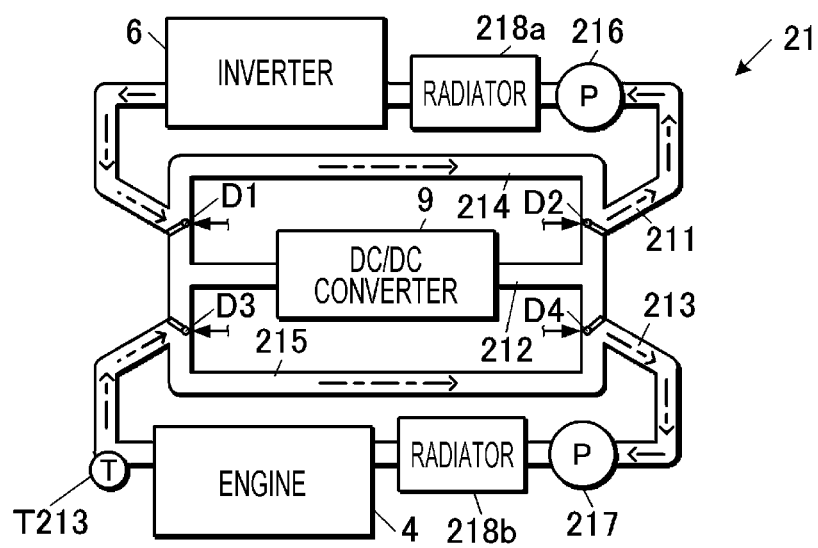

FIGS. 2A, 2B, and 2C illustrate switching of the cooling mechanism 21 with FIG. 2A illustrating a first switching pattern of the cooling mechanism 21, FIG. 2B illustrating a second switching pattern of the cooling mechanism 21, and FIG. 2C illustrating a third switching pattern of the cooling mechanism 21. In one embodiment, the first switching pattern may be referred to as a "first mode" of a cooling mechanism. In one embodiment, the second switching pattern may be referred to as a "second mode" and a "third mode" of the cooling mechanism. In one embodiment, the third switching pattern may be referred to as the "second mode" and a "fourth mode" of the cooling mechanism.

In the first switching pattern, the switching valves D1 and D2 are switched so that the first channel 211 communicates with the second channel 212, and the first pump 216 is driven to circulate liquid coolant through the first channel 211 and the second channel 212. Further, in the first switching pattern, the switching valves D3 and D4 are switched so that the third channel 213 communicates with the bypass channel 215, and the second pump 217 is driven to circulate liquid coolant through the third channel 213 and the bypass channel 215. Alternatively, when the engine 4 is not cooled in the first switching pattern, the second pump 217 may be stopped. In the first switching pattern, the inverter 6 and the DC/DC converter 9 are cooled by common liquid coolant flowing through the radiator 218a, and heat from the DC/DC converter 9 is released into the liquid coolant. The cooling level for the inverter 6 is reduced due to the heat released into the liquid coolant.

In the second switching pattern and the third switching pattern, the switching valves D1 and D2 are switched so that the first channel 211 communicates with the bypass channel 214 and is cut off from the second channel 212. Then, the first pump 216 is driven to circulate liquid coolant through the first channel 211. In the first channel 211, the liquid coolant absorbs heat from the inverter 6, and heat is released into ambient air by the radiator 218a. Since heat from the DC/DC converter 9 is not released into the liquid coolant, which cools the inverter 6, the cooling levels for the inverter 6 in the second switching pattern and the third switching pattern are higher than the cooling level in the first switching pattern.

Accordingly, the controller 22 can switch between cooling levels for the inverter 6 by switching the path for liquid coolant in the cooling mechanism 21 to the first switching pattern or to either one of the second switching pattern and the third switching pattern.

Cooling modes for the engine 4 and the DC/DC converter 9 differ in the second switching pattern and in the third switching pattern. In the second switching pattern, the switching valves D3 and D4 are switched so that the second channel 212 communicates with the third channel 213, and the second pump 217 is driven to circulate liquid coolant through the second channel 212 and the third channel 213. In the second switching pattern, the DC/DC converter 9 and the engine 4 are cooled by common liquid coolant flowing through the radiator 218b. The maximum temperature at which the engine 4 is capable of normal operation (for example, 100° C.) is higher than the maximum temperature at which the DC/DC converter 9 is capable of normal operation (for example, 65° C.). Accordingly, when the temperature of the engine 4 is high, the DC/DC converter 9 cannot be cooled in the second switching pattern.

In the third switching pattern, the switching valves D3 and D4 are switched so that the third channel 213 communicates with the bypass channel 215 and is cut off from the second channel 212. The second pump 217 is driven to circulate liquid coolant through the third channel 213, and thus the engine 4 is cooled in the third switching pattern. In contrast, liquid coolant in the second channel 212 does not circulate, and the cooling level for the DC/DC converter 9 decreases.

Figure 3:
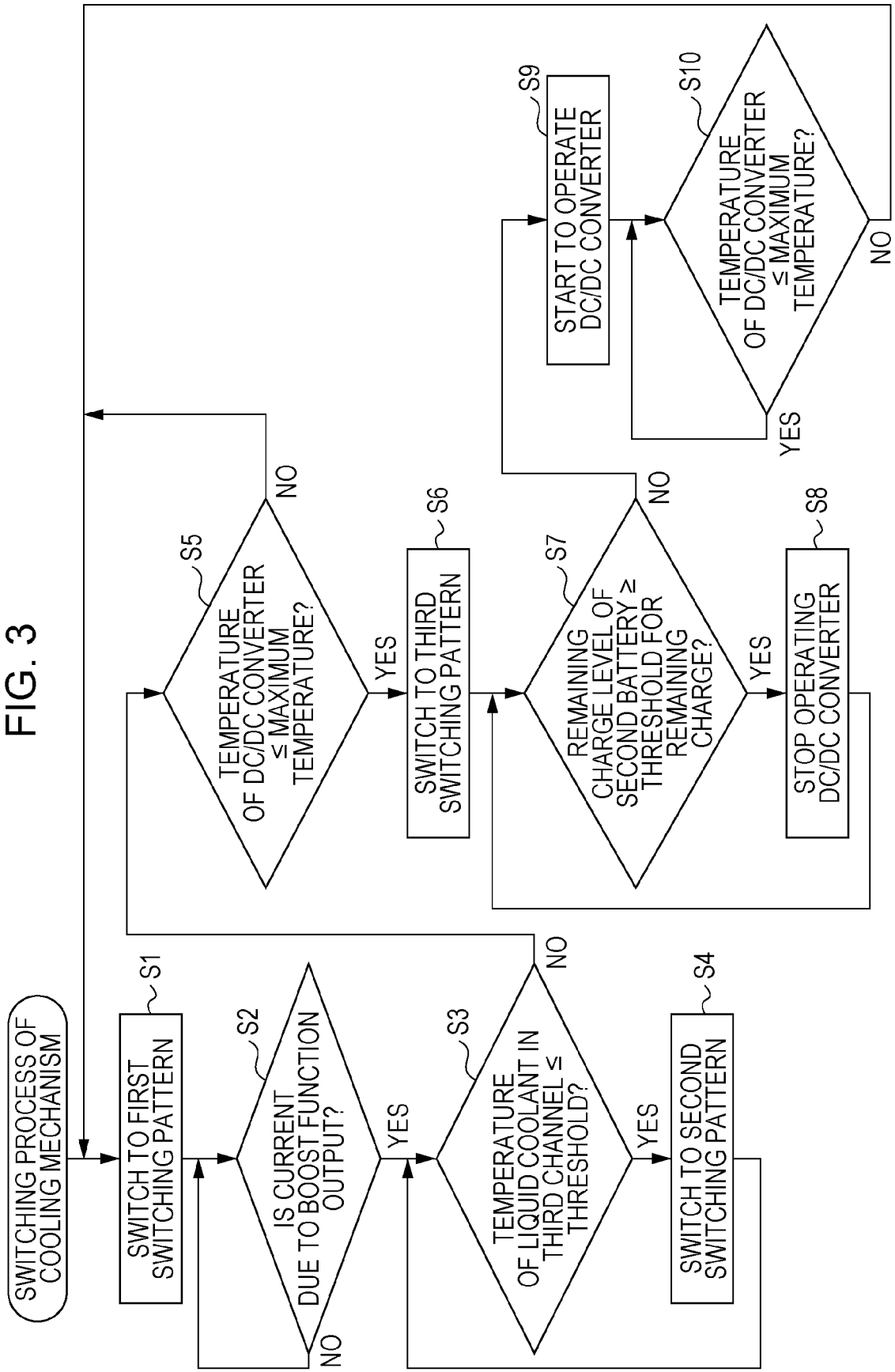
FIG. 3 is a flowchart illustrating a switching process of the cooling mechanism performed by a controller.

FIG. 3 is a flowchart illustrating a switching process of the cooling mechanism 21 performed by the controller 22 of the cooling apparatus 20. In the initial state, the controller 22 of the cooling apparatus 20 switches the switching valves D1 to D4 to the first switching pattern (step S1) and thus enables the cooling mechanism 21 to perform normal cooling operation. Then, the controller 22 monitors a signal representing the current that is output from the inverter 6 and determines whether a current due to the boost function is output (step S2). The determination process in step S2 is repeated until the current due to the boost function starts to be output.

When the current due to the boost function is output and the determination is YES in step S2 as a result, the controller 22 first determines whether the temperature of liquid coolant in the third channel 213 (the temperature of liquid coolant for the engine 4) is equal to a threshold or lower (step S3). The threshold is set based on the maximum temperature at which the DC/DC converter 9 is capable of normal operation (for example, 65° C.) and is set to a boundary (for example, 65° C.±a margin) that determines whether the DC/DC converter 9 can be cooled below the maximum temperature. Accordingly, when the engine 4 is at a high temperature and the temperature of the liquid coolant is higher than the maximum temperature for the DC/DC converter 9 (for example, the temperature of the liquid coolant is 80° C.), the determination is NO in step S3. When the engine 4 is at a low temperature and the temperature of the liquid coolant is lower than the maximum temperature for the DC/DC converter 9 (for example, the temperature of the liquid coolant is 50° C.), the determination is YES in step S3.

When the determination is YES in step S3, the controller 22 switches the switching valves D1 to D4 to the second switching pattern (step S4). This switching increases the cooling level for the inverter 6 as described above.

In contrast, when the determination is NO in step S3, the controller 22 determines whether the temperature of the DC/DC converter 9 is equal to or lower than the maximum temperature (step S5). In one embodiment, the maximum temperature may be referred to as a "threshold". When it is determined that the temperature of the DC/DC converter 9 is equal to or lower than the maximum temperature, the controller 22 switches the switching valves D1 to D4 to the third switching pattern (step S6). This switching also increases the cooling level for the inverter 6 as described above.

When the determination is YES in step S3 and the switching valves D1 to D4 are switched to the second switching pattern in step S4, the controller 22 repeatedly performs the determination in step S3 after the boost function of the inverter 6 is activated. When the determination becomes NO in step S3 because of an increase in the temperature of the third channel 213, the process proceeds to step S5.

After switching the switching valves D1 to D4 to the third switching pattern in step S6, the controller 22 next determines whether the remaining charge level of the second battery 8 is equal to or higher than the threshold for the remaining charge (step S7). When it is determined that the remaining charge level is equal to or higher than the threshold, the controller 22 stops output from the DC/DC converter 9 (step S8). Then, the controller 22 returns the process to step S7. Since the DC/DC converter 9 provides output to supplement output from the second battery 8, sufficient remaining charge of the second battery 8 ensures unproblematic operation of the electric vehicle 1 even when the DC/DC converter 9 stops providing output.

In contrast, when the determination is NO in step S7 because electric power is supplied to low-voltage devices from the second battery 8, the controller 22 starts to operate the DC/DC converter 9 (step S9). Thereafter, the controller 22 repeats a process to determine whether the temperature of the DC/DC converter 9 is equal to or lower than the maximum temperature (step S10). In one embodiment, The maximum temperature may be referred to as a "threshold". Then, when it is determined that the maximum temperature has been exceeded, the controller 22 returns the process to step S1 and switches the switching valves D1 to D4 to the first switching pattern, which is the initial state.

When it is determined in step S5 that the temperature of the DC/DC converter 9 has exceeded the maximum temperature, the controller 22 also returns the process to step S1 and switches the switching valves D1 to D4 to the first switching pattern, which is the initial state.

Cooling Operation while Boost Function is Active-when Liquid Coolant for Engine 4 is at Low Temperature In the case where liquid coolant for the engine 4 is at a low temperature when the boost function of the inverter 6 is activated, the cooling mechanism 21 is switched from the first switching pattern (FIG. 2A) to the second switching pattern (FIG. 2B), and the cooling level for the inverter 6 is increased in the switching process of the cooling mechanism 21 described above (step S2 to S4). Consequently, the rate of increase in the temperature of the inverter 6 can be reduced while the boost function is active. In addition, the DC/DC converter 9 is sufficiently cooled at this time by low-temperature liquid coolant that has circulated through the third channel 213.

When the temperature of liquid coolant circulating through the second channel 212 and the third channel 213 thereafter exceeds the threshold because of heat generated by the engine 4 or other components, the cooling mechanism 21 is switched to the third switching pattern (FIG. 2C), and the DC/DC converter 9 is stopped if the supply capacity of electric power exceeds the amount to be used by the low-voltage devices by a sufficient margin (NO in step S3 followed by steps S5 to S8). Consequently, the cooling level for the inverter 6 can be kept at a high level while the temperature of the DC/DC converter 9 is kept at the maximum temperature or lower by stopping operation of the DC/DC converter 9.

Further, when the DC/DC converter 9 is insufficiently cooled (when the temperature of the DC/DC converter 9 exceeds the maximum temperature) after the DC/DC converter 9 starts to operate because the margin of electric power supplied to the low-voltage devices decreases, the cooling mechanism 21 is returned to the first switching pattern (FIG. 2A), and the inverter 6 and the DC/DC converter 9 are cooled at normal cooling levels (NO in step S7 followed by step S9, NO in step S10, and step S1).

In this way, in the case where liquid coolant for the engine 4 is at a low temperature when the boost function is activated, a period between the cooling mechanism 21 being switched to the second switching pattern and being returned to the first switching pattern can be sufficiently long, and the cooling level for the inverter 6 is high during this period. Consequently, a large amount of heat generated by the inverter 6 while the boost function is active can efficiently be removed, and the inverter 6 is unlikely to reach a high temperature.

Cooling Operation while Boost Function is Active-when Liquid Coolant for Engine 4 is at High Temperature In the case where liquid coolant for the engine 4 is at a high temperature when the boost function of the inverter 6 is activated, the cooling mechanism 21 is switched from the first switching pattern (FIG. 2A) to the third switching pattern (FIG. 2C), and the cooling level for the inverter 6 is increased in the switching process of the cooling mechanism 21 in FIG. 3 (step S2 followed by NO in step S3, step S5, and step S6). Consequently, the rate of increase in the temperature of the inverter 6 can be reduced while the boost function is active.

Thereafter, while the supply capacity of electric power exceeds the amount to be used by the low-voltage devices by a sufficient margin, the DC/DC converter 9 is in a stopped state. When the margin of electric power supplied to the low-voltage devices decreases, the DC/DC converter 9 starts to operate (steps S7 to S9). Then, when the DC/DC converter 9 is insufficiently cooled because of the operation of the DC/DC converter 9 (when the temperature of the DC/DC converter 9 exceeds the maximum temperature), the cooling mechanism 21 is returned to the first switching pattern (FIG. 2A), and the inverter 6 and the DC/DC converter 9 are cooled at normal cooling levels (NO in step S10 followed by step S1).

In this way, even in the case where liquid coolant for the engine 4 is at a high temperature, a period between the cooling mechanism 21 being switched to the third switching pattern and being returned to the first switching pattern can be relatively long when the supply capacity of electric power exceeds the amount to be used by the low-voltage devices by a sufficient margin, and the cooling level for the inverter 6 is high during this period. Consequently, a large amount of heat generated by the inverter 6 while the boost function is active can efficiently be removed, and the inverter 6 is unlikely to reach a high temperature.

In addition, when the supply capacity of electric power barely matches the amount to be used by the low-voltage devices or the temperature of the DC/DC converter 9 exceeds the maximum temperature, the cooling level for the inverter 6 is returned to a normal level, and thereby an anomaly in the DC/DC converter 9 and an anomaly in the supply of electric power to the low-voltage devices are unlikely to occur.

Boost Process

Figure 4:
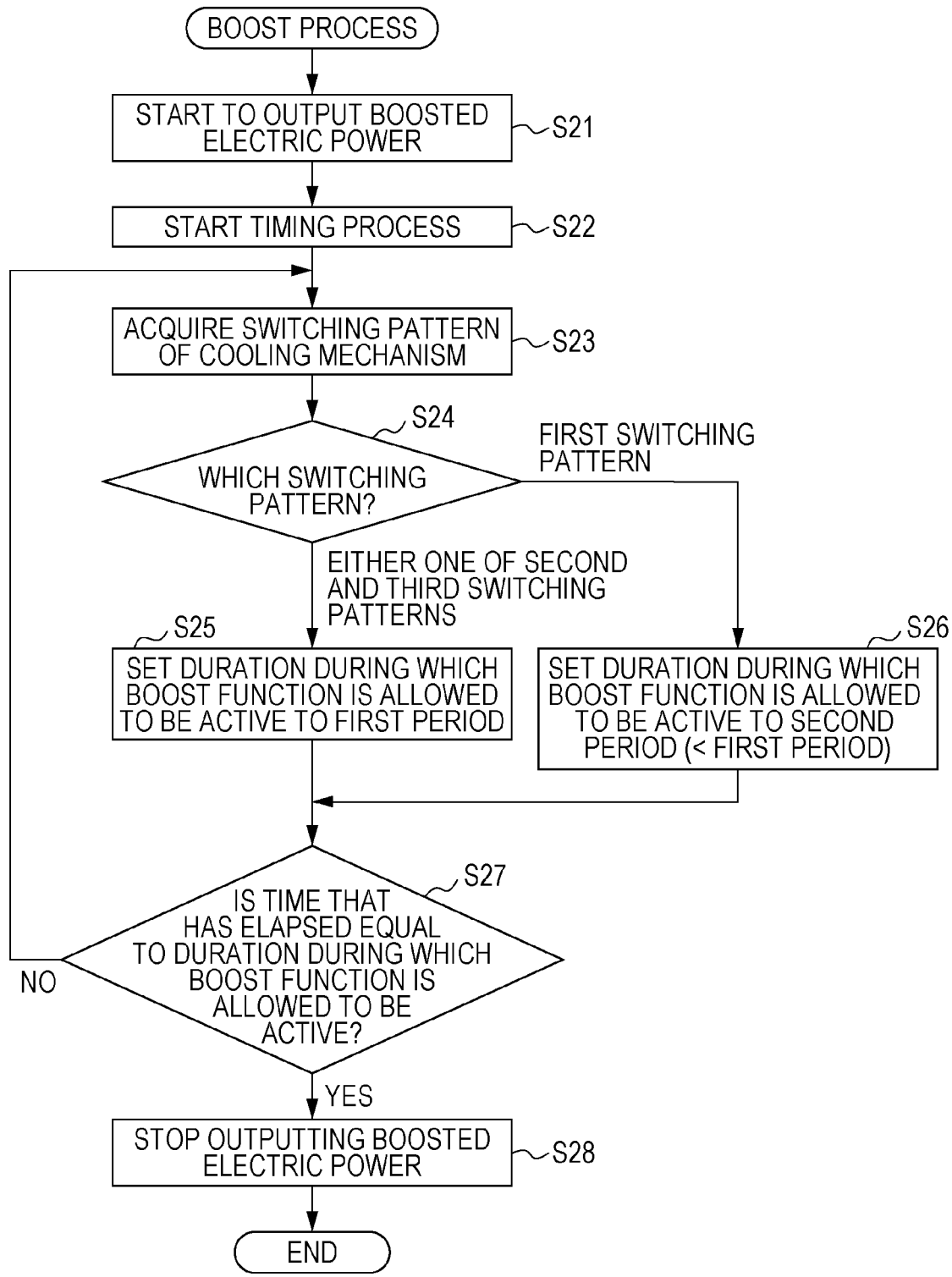
FIG. 4 is a flowchart illustrating a process for controlling output from an inverter, the process being performed by a driving controller.

FIG. 4 is a flowchart illustrating a boost process of the inverter 6, the boost process being performed by the driving controller 15. While the electric vehicle 1 is running, the driving controller 15 receives an operation signal from the driving operation unit 13 and information indicating conditions of the units in the electric vehicle 1 (such as output from the engine 4 and the electric motor 7, the remaining charge level of the first battery 5, and the temperature). Then, the driving controller 15 calculates, based on these parameters, requested torque and determines whether to activate the boost function of the inverter 6 to obtain large torque from the electric motor 7. In addition, the driving controller 15 determines whether the boost function is allowed to be activated. The boost function is not allowed to be activated until a predetermined time elapses after the preceding activation of the boost function so that the boost function is not activated consecutively during a short period. Consequently, when it is determined that the boost function is allowed to be activated and that the boost function is to be activated, the driving controller 15 starts a boost process in FIG. 4.

Once the boost process is started, the driving controller 15 causes the inverter 6 to start to output boosted electric power (step S21) and further starts a timing process (step S22). Next, the driving controller 15 acquires information regarding the switching pattern of the cooling mechanism 21 from the controller 22 of the cooling apparatus 20 (step S23) and determines whether the cooling mechanism 21 is in either one of the second and third switching patterns or whether the cooling mechanism 21 is in the first switching pattern (step S24). If it is determined that the cooling mechanism 21 is in either one of the second and third switching patterns, the duration during which the boost function is allowed to be active is set to a first period (step S25). If it is determined that the cooling mechanism 21 is in the first switching pattern, the duration during which the boost function is allowed to be active is set to a second period that is shorter than the first period (step S26). The lengths of the first and second periods are determined in advance based on such parameters as the worst value for the duration of boost, the worst value being determined by using a test or the like so that the inverter 6 is unlikely to be degraded in each cooling condition. Further, the driving controller 15 determines whether the time that has elapsed is equal to the duration during which the boost function is allowed to be active (step S27). If the determination is NO, the process returns to step S23, and if the determination is YES, the driving controller 15 stops output of the boosted electric power from the inverter 6 (step S28). Then, the driving controller 15 terminates the boost process.

When the cooling mechanism 21 can be switched to either one of the second and third switching patterns, in which the inverter 6 can efficiently be cooled, the duration during which the boost function is active can be lengthened in the boost process of this type. In addition, the duration of boost can be set to a short period such that no anomaly is caused to the inverter 6 in the case where the cooling mechanism 21 cannot be switched to the second switching pattern nor to the third switching pattern when the boost function is activated because of the condition of the DC/DC converter 9 or other reasons or in the case where the cooling mechanism 21 is returned to the first switching pattern after a short period.

Control to change the duration of boost is not limited to the above method. For example, the driving controller 15 may change, based on the measured temperature of the inverter 6 or the measured temperature of liquid coolant to cool the inverter 6, the duration of boost so that the duration of boost increases as the temperature decreases.

As described above, according to the embodiment, the controller 22 of the cooling apparatus 20 for the electric vehicle 1 switches, based on the output from the inverter 6, the cooling mechanism 21 and thus switches between the cooling levels for the inverter 6. Consequently, when the amount of generated heat increases because of an increase in the output from the inverter 6, the cooling level for the inverter 6 can be increased before the temperature of the inverter 6 increases, leading to efficient cooling being provided to the inverter 6. Thus, it is unlikely that the inverter 6 reaches too high a temperature because of insufficient cooling provided to the inverter 6.

The switching of the cooling levels for the inverter 6 is controlled based on the output from the inverter 6. This control includes switching based on the measured output from the inverter 6 and also includes switching based on, for example, a request for output from the inverter 6 in the case where the output from the inverter 6 is linked to the request for output.

Further, according to the embodiment, the controller 22 of the cooling apparatus 20 for the electric vehicle 1 switches, based on the activation of the boost function of the inverter 6, the cooling mechanism 21 to either one of the second and third switching patterns and thus increases the cooling levels for the inverter 6. Consequently, the boost function, which increases the amount of heat generated by the inverter 6, is stably kept active. On that occasion, the duration during which the boost function is allowed to be active may be set to a long period when the cooling level is increased, and consequently the duration of boost can be lengthened.

Further, according to the embodiment, the cooling mechanism 21 of the cooling apparatus 20 for the electric vehicle 1 includes the first channel 211, which enables liquid coolant to flow along the inverter 6, the second channel 212, which enables liquid coolant to flow along the DC/DC converter 9, and the third channel 213, which enables liquid coolant to flow along the engine 4. The controller 22 increases the cooling level for the inverter 6 by switching from the mode in which liquid coolant circulates through the first channel 211 and the second channel 212 to the mode in which liquid coolant circulates through the first channel 211 without flowing through the second channel 212. For example, the DC/DC converter 9 can be stopped for a relatively long period when the remaining charge level of the second battery 8 is sufficiently high. Thus, temporarily decreasing the cooling level for the DC/DC converter 9 is unlikely to cause inconvenience to the operation of the electric vehicle 1. As described above, the cooling levels for the inverter 6 are switched by switching between the cooling modes for the DC/DC converter 9. This configuration enables cost reduction without resorting to an expensive solution such as adding excess total cooling power to the cooling mechanism 21 to switch between the cooling levels for the inverter 6.

Further, according to the embodiment, the controller 22 of the cooling apparatus 20 for the electric vehicle 1 determines, based on the temperature of liquid coolant in the third channel 213, whether to select the second switching pattern or the third switching pattern when switching the cooling mechanism 21 from the first switching pattern to either one of the second and third switching patterns. Consequently, the DC/DC converter 9 is not heated by the liquid coolant in the third channel 213, and the DC/DC converter 9 is less frequently heated above the maximum temperature. Thus, the cooling level for the inverter 6 is decreased to the original level less frequently.

Further, according to the embodiment, the controller 22 of the cooling apparatus 20 for the electric vehicle 1 returns the cooling mechanism 21 to the first switching pattern when the DC/DC converter 9 is heated above the maximum temperature after the cooling mechanism 21 is switched to either one of the second and third switching patterns. Consequently, it is unlikely that the DC/DC converter 9 remains heated above the maximum temperature because the cooling level for the DC/DC converter 9 is decreased in return for an increase in the cooling level for the inverter 6.

The embodiment of the disclosure has been described as above. However, the disclosure is not limited to the embodiment described above. For example, although the engine 4, which is an internal-combustion engine, is cooled as an example by using the third channel 213 in the above embodiment, the third channel 213 may be used to cool other heat-generating components such as the first battery 5. In such a case, the electric vehicle may be an electric vehicle (EV) including no internal-combustion engine. Further, although the cooling capacity for the inverter 6 is increased based on the activation of the boost function of the inverter 6 in the above embodiment, the cooling level for the inverter 6 may be increased when the output from the inverter 6 is increased because of a reason other than the boost function.

Although the inverter 6 is cooled by using the cooling mechanism 21, which includes channels for liquid coolant, in the above embodiment, a different configuration such as includes cooling fans may be adopted. Further, when a configuration having channels for liquid coolant is adopted to cool the inverter 6, configurations of channels and switching valves, temperature conditions for switching between channels, and other parameters are not limited to the examples in the embodiment and are modifiable in various ways. Other details described in the embodiment are modifiable as appropriate within the spirit of the disclosure.

The controller 22 illustrated in FIG. 1 can be implemented by circuitry including at least one semiconductor integrated circuit such as at least one processor (e.g., a central processing unit (CPU)), at least one application specific integrated circuit (ASIC), and/or at least one field programmable gate array (FPGA). At least one processor can be configured, by reading instructions from at least one machine readable tangible medium, to perform all or a part of functions of the controller 22. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the non-volatile memory may include a ROM and a NVRAM. The ASIC is an integrated circuit (IC) customized to perform, and the FPGA is an integrated circuit designed to be configured after manufacturing in order to perform, all or a part of the functions of the modules illustrated in FIG. 1.

The invention claimed is:

1. An electric-vehicle-mounted cooling apparatus to be mounted in or on an electric vehicle, the electric vehicle comprising an electric motor configured to output power for driving, a first battery configured to store electric power for driving, and an inverter configured to receive the electric power from the first battery and to drive the electric motor, the electric-vehicle-mounted cooling apparatus comprising:
a cooling mechanism configured to cool the inverter; and
a controller configured to switch a cooling level for the inverter, the inverter being configured to be cooled by the cooling mechanism,
wherein, based on an output from the inverter, the controller is configured to switch the cooling level for the inverter by adjusting a temperature of a liquid coolant prior to the liquid coolant flowing along the inverter,
wherein the inverter has a boost function that enables temporary output of electric power larger than rated electric power that can continuously be output,
wherein the controller is configured to switch, based on activation of the boost function, the cooling mechanism from a first mode to a second mode in which the cooling level for the inverter is higher than in the first mode,
wherein the electric vehicle further comprises a second battery configured to supply a lower power-supply voltage than the first battery, a direct-current/direct-current (DC/DC) converter configured to supply the lower power-supply voltage by receiving the electric power from the first battery, and a heat-generating component,
wherein the cooling mechanism comprises a first channel for flowing the liquid coolant along the inverter, a second channel for flowing the liquid coolant along the DC/DC converter, a third channel for flowing the liquid coolant to along the heat-generating component, and a switching valve configured to switch a path for the liquid coolant flowing through the first channel, the second channel, and the third channel,
wherein the liquid coolant circulates through the first channel and the second channel in the first mode,
wherein the liquid coolant circulates through the first channel without flowing through the second channel in the second mode, and
wherein the output from the inverter is determined from numerical data representing:
an output from a temperature sensor; and
current that is output from the inverter.

2. The electric-vehicle-mounted cooling apparatus according to claim 1, wherein, upon switching the cooling mechanism from the first mode to the second mode, the controller is configured to switch, based on a temperature of the liquid coolant in the third channel, the cooling mechanism to either one of a third mode or a fourth mode, and
wherein the liquid coolant circulates through the second channel and the third channel in the third mode and the liquid coolant does not circulate through the second channel in the fourth mode.

3. The electric-vehicle-mounted cooling apparatus according to claim 1, wherein the controller switches the cooling mechanism to the first mode in a case where a temperature of the DC/DC converter exceeds a threshold after the controller switches the cooling mechanism to the second mode.

4. The electric-vehicle-mounted cooling apparatus according to claim 2, wherein the controller switches the cooling mechanism to the first mode in a case where a temperature of the DC/DC converter exceeds a threshold after the controller switches the cooling mechanism to the second mode.

5. An electric-vehicle-mounted cooling apparatus to be mounted in or on an electric vehicle, the electric vehicle comprising an electric motor configured to output power for driving, a first battery configured to store electric power for driving, and an inverter configured to receive the electric power from the first battery and to drive the electric motor, the electric-vehicle-mounted cooling apparatus comprising:
a cooling mechanism configured to cool the inverter; and
circuitry configured to switch a cooling level for the inverter, the inverter being configured to be cooled by the cooling mechanism,
wherein, based on an output from the inverter, the circuitry is configured to switch the cooling level for the inverter by adjusting a temperature of a liquid coolant prior to the liquid coolant flowing along the inverter, and
wherein the output from the inverter is determined from numerical data representing:
an output from a temperature sensor; and
current that is output from the inverter.

6. An electric-vehicle-mounted cooling apparatus to be mounted in or on an electric vehicle, the electric vehicle comprising an electric motor configured to output power for driving, a first battery configured to store electric power for driving, and an inverter configured to receive the electric power from the first battery and to drive the electric motor, the electric-vehicle-mounted cooling apparatus comprising:
a cooling mechanism configured to cool the inverter; and
a controller configured to switch a cooling level for the inverter, the inverter being configured to be cooled by the cooling mechanism,
wherein the controller is configured to switch the cooling level based on output from the inverter,
wherein the inverter has a boost function that enables temporary output of electric power larger than rated electric power that can continuously be output,
wherein the controller is configured to switch, based on activation of the boost function, the cooling mechanism from a first mode to a second mode in which the cooling level for the inverter is higher than in the first mode,
wherein the electric vehicle further comprises a second battery configured to supply a lower power-supply voltage than the first battery, a direct-current/direct-current (DC/DC) converter configured to supply the lower power-supply voltage by receiving the electric power from the first battery, and a heat-generating component,
wherein the cooling mechanism comprises a first channel for flowing the liquid coolant along the inverter, a second channel for flowing the liquid coolant along the DC/DC converter, a third channel for flowing the liquid coolant to along the heat-generating component, and a switching valve configured to switch a path for the liquid coolant flowing through the first channel, the second channel, and the third channel,
wherein the liquid coolant circulates through the first channel and the second channel in the first mode, and
wherein the liquid coolant circulates through the first channel without flowing through the second channel in the second mode.

* * * * *